United States Patent

Nakamura et al.

[11] Patent Number: 5,891,796
[45] Date of Patent: Apr. 6, 1999

[54] METHOD FOR WIRE-BONDING A COVERED WIRE

[75] Inventors: Osamu Nakamura, Kokubunji; Kazumasa Sasakura, Musashi Murayama, both of Japan

[73] Assignee: Kabushiki Kaisha Shinkawa, Tokyo, Japan

[21] Appl. No.: 759,228

[22] Filed: Dec. 5, 1996

[30] Foreign Application Priority Data

Dec. 5, 1995 [JP] Japan ................................. 7-344554

[51] Int. Cl.$^6$ ................................................. H01L 21/44
[52] U.S. Cl. ........................ 438/617; 438/123; 228/180.5
[58] Field of Search ................................ 438/617, 123, 438/106; 228/179.1, 179.21, 179.22, 180.5, 904

[56] References Cited

U.S. PATENT DOCUMENTS

| | | |
|---|---|---|
| 4,597,522 | 7/1986 | Kibayashi . |
| 4,842,662 | 6/1989 | Jacodi . |
| 4,864,514 | 9/1989 | Yamanaka . |
| 5,176,310 | 1/1993 | Akiyama et al. . |
| 5,310,702 | 5/1994 | Yoshida et al. . |
| 5,370,300 | 12/1994 | Okumura . |
| 5,527,742 | 6/1996 | Weiler et al. . |

FOREIGN PATENT DOCUMENTS 2-213146  8/1990  Japan .

Primary Examiner—Kevin M. Picardat
Attorney, Agent, or Firm—Koda & Androlia

[57] ABSTRACT

To prevent melting and scattering of a covering-film during ball formation, the covering-film, at the time a ball is formed, has been completely removed from the portion of a covered wire which corresponds to the tail length that protrudes from the tip of a capillary.

2 Claims, 3 Drawing Sheets

METHOD FOR WIRE-BONDING A COVERED WIRE

BACKGROUND OF THE INVENTION

1. Field of the Invention

The present invention relates to a method for wire-bonding a covered wire.

2. Prior Art

Conventionally, as a method for wire-bonding a covered wire, a method disclosed in Japanese Patent Application Laid-Open (Kokai) No. 2-213146 has been known. This method is disclosed in FIG. 3. A covered wire 1 is comprised of a core wire 1a, which is a conductor, and a covering-film 1b, which consists of a macromolecular resin material with electrical insulating properties and is covered as a coating around the circumference of the core wire 1a. The covered wire 1 is supplied from a wire spool, which is not shown in the Figures, and passed through a capillary 4 via a second clamper 2, which is for holding the wire, and a first clamper 3, which is for cutting the wire. The covered wire 1 thus passing through the capillary 4 is connected to the pad of a semiconductor pellet 5 and the lead 6a of a lead frame 6.

FIG. 3(a) shows a state in which a ball 1c has been formed at the tip of the covered wire 1, and the first clamper 3 and second clamper 2 are opened. Furthermore, a removed portion (exposed portion 1d) has been formed beforehand by a method which will be described below in an area extending for a predetermined distance from the tip of the covered wire 1. As seen from FIGS. 3(a) to 3(b), the capillary 4 is lowered so that the ball 1c is bonded to the first bonding point of a pad of the semiconductor pellet 5. Next, the capillary 4 is raised, moved to a point above one of the leads 6a of the lead frame 6 and then lowered; and as shown in FIG. 3(c), the exposed portion Id is bonded to the second bonding point of the lead 6a.

Next, as shown in FIG. 3(d), the capillary 4 is raised by a distance $L_1$ from the surface of the lead 6a. This distance $L_1$ is calculated by use of information concerning the first and second bonding positions and the initial set conditions of the bonding apparatus, etc., as described in Japanese Patent Application Laid-Open No. 2-213146. When the first clamper 3 and the capillary 4 are thus raised by a distance $L_1$, the first clamper 3 closes and holds the covered wire 1. Next, with the first clamper 3 closed, the clamper 3 is raised together with the capillary 4; and as shown in FIG. 3(e), the covered wire 1 is cut from the base area of the second bonding point. In this case, the first clamper 3 and the capillary 4 are raised so that an intended covering-film removal area 1e comes between the pair of discharge electrodes 7 and 8. As result, the covered wire 1 protrudes from the tip of the capillary 4 by the length $L_1$, and a part of the exposed portion 1d remains at the tip of the covered wire 1.

Next, as shown in FIG. 3(f), the pair of discharge electrodes 7 and 8 are moved in close to the covered wire 1 from both sides in a non-contact state. A voltage is then applied to the discharge electrodes 7 and 8 so that an electric discharge is caused to take place between the electromagnetic parts 71 and 81 and the core wire 1a with the covering-film 1b in between. As a result of the discharge energy, as shown in FIG. 3(g), a portion of the covering-film 1b located at a predetermined position on the covered wire 1 is removed. In other words, the exposed portion 1d shown in FIG. 3(a) is formed. Next, as shown in FIG. 3(g), the discharge electrodes 7 and 8 are withdrawn in a direction away from the covered wire 1.

Next, as shown by the chain lines, the second clamper 2 is closed, and the first clamper 3 is opened. Afterward, as shown in FIG. 3(h), the first clamper 3 and the capillary 4 are lowered, in relative terms, by a distance $L_2$ from the state shown in FIG. 3(g). In this case, since the covered wire 1 is held (restrained) by the second clamper 2, the covered wire 1 is brought into the interior of the capillary 4 by a distance $L_2$, so that the tip of the covered wire 1 protrudes from the tip of the capillary 4 by a tail length $L_3$. In this case, the tail length $L_3$ of the tip of the covered wire 1 corresponds to a part of the exposed portion 1d, from which the covering-film 1b has been removed.

Next, as shown in FIG. 3(i), the first clamper 3 is closed, and the second clamper 2 is opened; and the capillary 4 is raised to a ball forming level as shown in FIG. 3(j). Next, as shown by chain lines, the discharge electrode 8 is moved so that the electrode surface 8a for ball formation is positioned directly beneath the tip of the covered wire 1. Then, as shown in FIG. 3(k), a high voltage is applied across the discharge electrode 8 and covered wire 1, thus forming the ball 1c. Next, as shown by the chain lines, the discharge electrode 8 is returned to its original position. Then, the first clamper 3 is opened, and the capillary 4 is positioned above the next bonding point (see FIG. 3(a)). Afterward, the series of operations shown in FIGS. 3(a) through (k) are repeated.

In the prior art described above, as shown in FIG. 3(f), only the covering-film 1b at an intended covering-film removal area is removed which is a part of the wire and has the length $L_4$ required for the next wiring operation. Accordingly, as seen from FIG. 3(j), the covering-film 1b remains on the portion of the wire that corresponds to the tail length $L_3$ which protrudes from the tip of the capillary 4 during the formation of the ball 1c. As a result, when as shown in FIG. 3(k) a high voltage is applied to the tail length $L_3$ so as to form the ball 1, the covering-film 1b is melted and scattered by the discharge, and the tip of the capillary 4 is contaminated. Contaminant matter on the tip of the capillary 4 will adhere to the pressure-welded portions of the ball 1c as shown in FIG. 3(b) and to the pressure-welded portions of the lead as shown in FIG. 3(c), thus lowering the reliability of bonding.

SUMMARY OF THE INVENTION

The object of the present invention is to provide a method for wire-bonding a covered wire in which no melting or scattering of the covering-film occurs during ball formation.

The first means of the present invention for accomplishing the object in a method for wire-bonding a covered wire in which the covering-film on an intended lead-side bonding portion of the covered wire required for the next wiring operation is removed beforehand, a ball formed on the tip of the covered wire is bonded to the pad of a semiconductor pellet, and the covered wire is then fed out from the capillary and the exposed-core portion of the covered wire from which the covering-film has been removed is bonded to the lead of a lead frame, is characterized in that:

the covering-film has been completely removed from the tail length portion that protrudes from the tip of the capillary at the time of ball formation.

The second means of the present invention for accomplishing the object in a method for wire-bonding a covered wire in which the covering-film on an intended lead-side bonding portion of the length of the covered wire required for a next wiring operation is removed beforehand, a ball formed on the tip of the covered wire is bonded to the pad of a semiconductor pellet, and the covered wire is then fed out from the capillary and the exposed-core portion of the covered wire from which the covering-film has been removed is bonded to the lead of a lead frame, is characterized in that:

the covering-film of the covered wire is removed for the area that extends:
from an upper-limit position which is obtained by adding the tail length to the length required for the next wiring operation, or from an upper-limit position located at a slightly longer length than the upper-limit position,
to a lower-limit position which is obtained by subtracting the bonding length that is bonded to the next lead part from the length required for the next wiring operation, or to a lower-limit position located at a slightly shorter length than the lower-limit position.

DETAILED DESCRIPTION OF THE INVENTION

Figure 1:
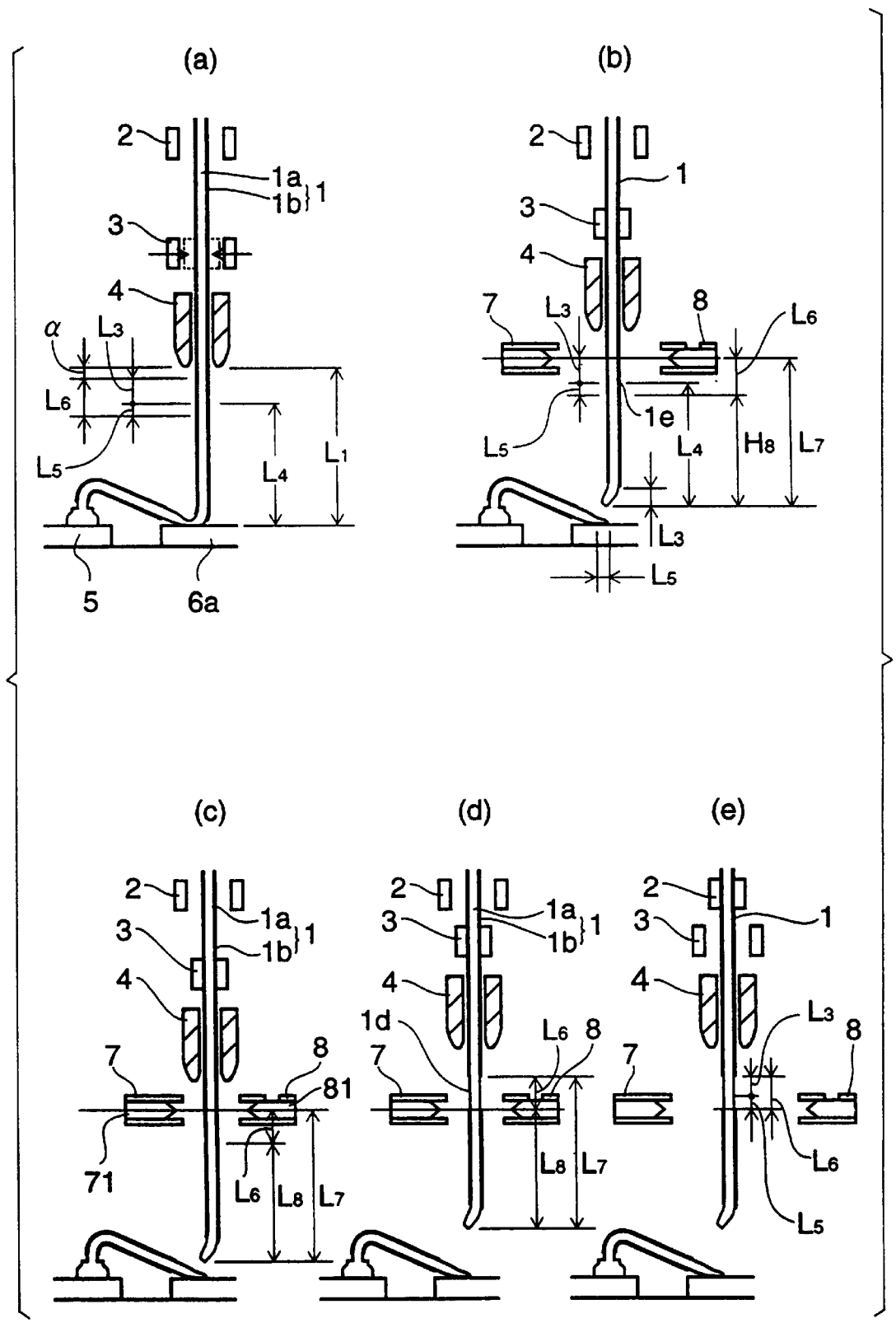
FIG. 1 is an explanatory diagrams which illustrate one embodiment of the method for wire-bonding a covered wire of the present invention.
Figure 2:
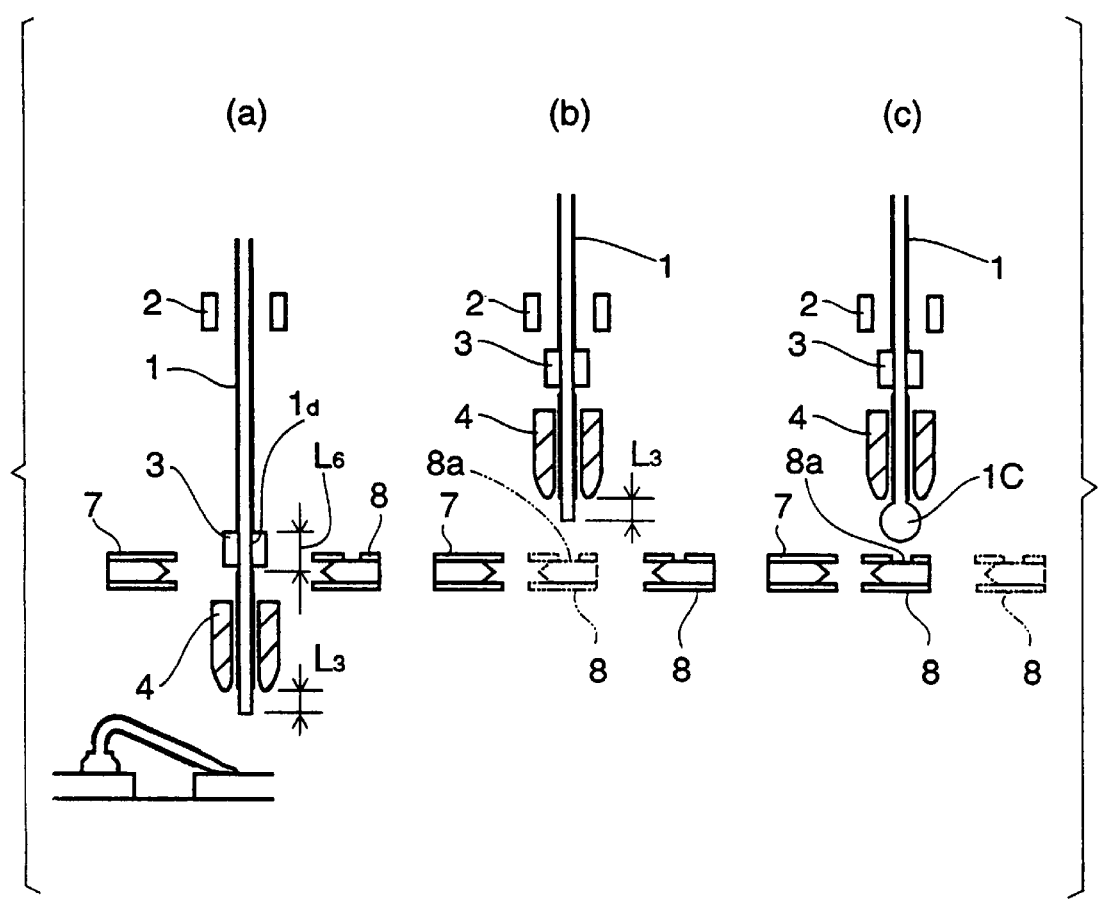
FIG. 2 is an explanatory diagrams which illustrate processes that are performed following the processes shown in FIG. 1.
Figure 3:
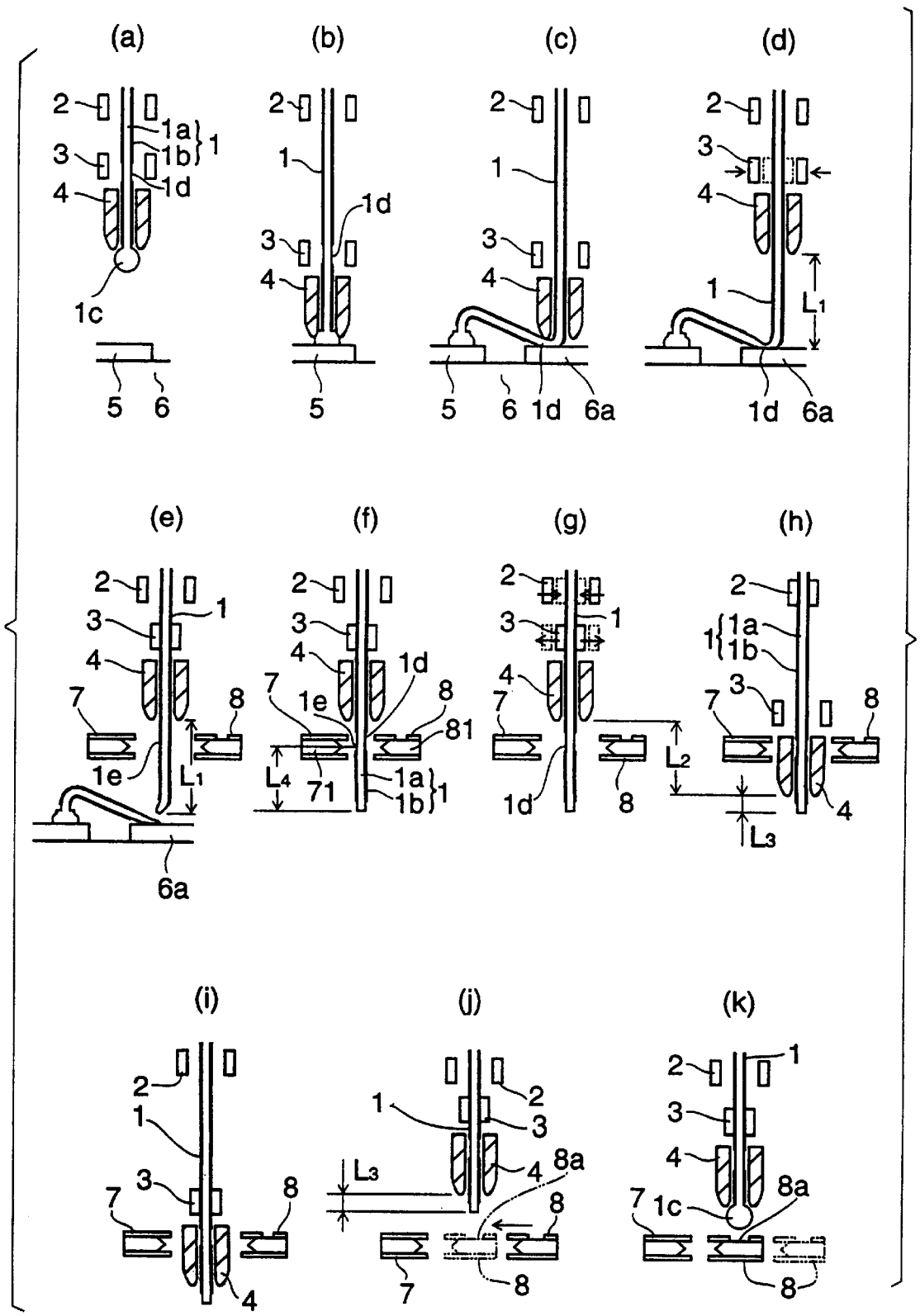
FIG. 3 is an explanatory diagrams which illustrate a conventional method for wire-bonding a covered wire.

Below, one manner of practice of the present invention will be described with reference to FIGS. 1 and 2. Here, FIG. 2 illustrates steps which follow the steps shown in FIG. 1. In this description, elements which are the same as in FIG. 3 or which correspond to elements in FIG. 3, are labeled with the same symbols. FIG. 1($a$) illustrates the state shown in FIG. 3($d$); in other words, the state in FIG. 1($a$) is a result of the steps shown in FIGS. 3($a$), ($b$) and ($c$). In FIGS. 1($a$) and ($b$), the height L, to which the capillary 4 is raised is expressed by Equation 1, wherein $L_4$ is the length required for the next wiring operation, $L_3$ is the tail length during formation of the ball 1$c$, and a is an extra length which prevents the discharge electrodes 7 and 8 from interfering with the capillary 4. Furthermore, the covering-film removal range $L_6$ is expressed by Equation 2, wherein $L_5$ is the bonding length bonded to the lead 6$a$. Accordingly, the upper-limit position $L_7$ of the covering-film removal range and the lower-limit position $L_8$ of the covering-film removal range is as shown in FIG. 1($b$) and as expressed by Equations 3 and 4.

$L_1 = L_3 + L_4 + \alpha$ [Equation 1]

$L_6 = L_3 + L_5$ [Equation 2]

$L_7 = L_4 + L_3$ [Equation 3]

$L_8 = L_7 - L_6 = (L_4 + L_3) - (L_3 + L_5) = L_4 - L_5$ [Equation 4]

As shown in FIG. 1($a$), when the capillary 4 is raised by a distance $L_1$, the first clamper 3 is closed and holds the covered wire 1 as shown by the chain lines. Next, with the first clamper 3 closed, the first clamper 3 is raised together with the capillary 4, thus cutting the covered wire 1 from the base of the second bonding point as shown in FIG. 1($b$). Accordingly, the area where the covering-film 1$b$ is to be removed from is positioned between the pair of discharge electrodes 7 and 8. In a conventional method, the intended covering-film removal area 1$e$ of the covered wire which is located at the point of length $L_4$ which is required for the next wiring operation is positioned between the discharge electrodes 7 and 8. In the manner of practice of the present invention, on the other hand, the portion of the wire located at the point of the length $L_7$ is positioned between the pair of discharge electrodes 7 and 8, and this point of the length $L_7$ is located higher than the intended covering-film removal area 1$e$, which is located at the length $L_4$ of the covered wire required for the next wiring operation, by a distance corresponding to the tail length $L_3$ required during the formation of the ball 1$c$.

Then, as shown in FIG. 1($c$), the pair of discharge electrodes 7 and 8 are caused to move in close to the covered wire 1 in a non-contact state from both sides. Next, a voltage is applied to the discharge electrodes 7 and 8 so that a discharge occurs between the electromagnetic parts 71 and 81 and the core wire 1$a$ with the covering-film 1$b$ in between, thus removing a portion of the covering-film 1$b$ located at the upper-limit position $L_7$ of the covering-film removal range of the covered wire 1 by the discharge energy generated at this time. Then, while the discharging of the discharge electrodes 7 and 8 is continued, the first clamper 3 and capillary 4 are gradually raised by a distance corresponding to the covering-film removal range $L_6$ as shown in FIG. 1($d$). As a result, the covering-film 1$b$ is removed so that an exposed-core portion 1$d$ is formed in the covering-film removal range $L_6$, which has an upper limit at $L_7$ and a lower limit at $L_8$.

The upper-limit position $L_7$ of the covering-film removal range and the lower-limit position $L_8$ of the covering-film removal range are as expressed by the Equations 3 and 4, and $L_4$ in the Equations 3 and 4 is the length of the covered wire required for the next wiring operation. Accordingly, the covering-film 1$b$ is removed from the portion of the covered wire corresponding to the tail length $L_3$ and to the bonding portion that is to be bonded to the next lead 6$a$. Next, as shown in FIG. 1($e$) the discharge electrodes 7 and 8 are withdrawn in the direction which causes the electrodes to move away from the covered wire 1. Then, the second clamper 2 is closed and the first clamper 3 is opened. Afterward, the capillary 4 is lowered as shown in FIG. 2($a$), thus causing the covered wire 1 to be brought into the interior of the capillary 4 so that only the tail length $L_3$ protrudes from the tip of the capillary 4.

Here, the covering-film removal range $L_6$ in which portions of the covering-film have been removed as described above consists of the bonding portion of the covered wire that is bonded to the lead 6$a$ in the next wiring operation and the portion of the covered wire that corresponds to the tail length $L_3$. Accordingly, all of the covering-film 1$b$ has been removed from the portion that corresponds to the tail length $L_3$ in the step of FIG. 2($a$), which is the state after the next wiring operation is completed. Consequently, when the ball 1$c$ is formed as in a conventional method by the processes shown in FIGS. 2($b$) and 2($c$), no covering-film 1$b$ is present on the portion of the wire corresponding to the tail length $L_3$. Accordingly, there is no melting or scattering of the covering-film 1$b$ during the formation of the ball 1$c$, and there is therefore very little contamination of the capillary 4; and as a result, the reliability of bonding is conspicuously improved.

Meanwhile, in the embodiment described above, the upper-limit position $L_7$ of the covering-film removal is set as "$L_4+L_3$"; however, it is possible to set this position using a slightly larger value, e.g., approximately 0.5 mm larger. Furthermore, the range $L_6$ in which the covering-film is removed is set as "$L_3+L_5$"; however, it is possible to make this range slightly larger e.g., approximately 0.5 mm larger. In other words, it is possible to set the lower-limit position $L_g$ of covering-film removal using a value smaller than "$L_4-L_5$".

According to the present invention, the covering-film is completely removed from the tail length portion that protrudes from the tip of the capillary at the time of ball formation. Accordingly, there is no melting or scattering of the covering-film during ball formation.

Furthermore, the covering-film of the covered wire is removed for the area that extends from an upper-limit position which is obtained by adding the tail length to the length required for the next wiring operation, or from an upper-limit position located at a slightly longer length than the upper-limit position, to a lower-limit position which is obtained by subtracting the bonding length that is bonded to the next lead part from the length required for the next wiring operation, or to a lower-limit position located at a slightly shorter length than the lower-limit position; accordingly, it is possible to assure that at the time of ball formation the covering-film of the tail length portion of the covered has been completely removed.

We claim:

1. A method for wire-bonding a covered wire wherein a covering-film on an intended lead-side bonding portion of the covered wire required for a next wiring operation is removed beforehand, a ball formed at a tip of the covered wire is bonded to a pad of a semiconductor pellet, and the covered wire is then fed out of a capillary so that an exposed-core portion of the covered wire from which the covering-film has been removed is bonded to a lead of a lead frame, said method being characterized in that the covering-film has been completely removed from a tail length portion that protrudes from a tip of the capillary at the time of ball formation.

2. A method for wire-bonding a covered wire wherein a covering-film on an intended lead-side bonding portion of the covered wire required for a next wiring operation is removed beforehand, a ball formed at a tip of the covered wire is bonded to a pad of a semiconductor pellet, and the covered wire is then fed out of a capillary so that an exposed-core portion of the covered wire from which the covering-film has been removed is bonded to a lead of a lead frame, said method being characterized in that the covering-film of the covered wire is removed for an area that extends:
from an upper-limit position which is obtained by adding a tail length to a length required for a next wiring operation, or from an upper-limit position located at a slightly longer length than the upper-limit position,
to a lower-limit position which is obtained by subtracting a bonding length that is bonded to a next lead part from a length required for the next wiring operation, or to a lower-limit position located at a slightly shorter length than the lower-limit position.

* * * * *